US012063849B2

(12) United States Patent
Hsu et al.

(10) Patent No.: US 12,063,849 B2
(45) Date of Patent: Aug. 13, 2024

(54) FLEXIBLE DISPLAY MODULE

(71) Applicant: AU Optronics Corporation, Hsin-Chu (TW)

(72) Inventors: Ming-Chang Hsu, Hsin-Chu (TW); Chih-Chieh Lin, Hsin-Chu (TW); Ming-Hsuan Yu, Hsin-Chu (TW); Ming-Wei Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 457 days.

(21) Appl. No.: 17/518,826

(22) Filed: Nov. 4, 2021

(65) Prior Publication Data
US 2022/0209146 A1   Jun. 30, 2022

(30) Foreign Application Priority Data

Dec. 31, 2020   (TW) .................................. 109147228

(51) Int. Cl.
H10K 77/10   (2023.01)
B32B 3/30   (2006.01)
B32B 7/14   (2006.01)
H10K 102/00   (2023.01)

(52) U.S. Cl.
CPC .............. *H10K 77/111* (2023.02); *B32B 3/30* (2013.01); *B32B 7/14* (2013.01); *B32B 2457/20* (2013.01); *H10K 2102/311* (2023.02)

(58) Field of Classification Search
CPC ............ H10K 77/111; H10K 2102/311; H10K 59/131; H10K 59/173; H10K 59/87–873; H10K 59/82; G09F 9/301; H01L 33/52–54
See application file for complete search history.

(56) References Cited

U.S. PATENT DOCUMENTS

| 2018/0180797 A1 | 6/2018 | Matsumoto |
| 2019/0173030 A1* | 6/2019 | Kim ..................... B32B 17/1077 |
| 2019/0355927 A1* | 11/2019 | Park ....................... H10K 71/00 |
| 2019/0361494 A1 | 11/2019 | Wu et al. |
| 2022/0199935 A1* | 6/2022 | Uhm ..................... H10K 50/841 |

FOREIGN PATENT DOCUMENTS

| CN | 105242799 A | 1/2016 | |
| CN | 107230429 A | * 10/2017 | ............ G09F 9/301 |
| CN | 107230429 A | 10/2017 | |

(Continued)

*Primary Examiner* — Evan G Clinton
(74) *Attorney, Agent, or Firm* — WPAT, P.C

(57) ABSTRACT

A flexible display module includes a first light-transmissive layer and a first display layer. The first light-transmissive layer includes a display surface. The first light-transmissive layer has a first width in a second direction. The first display layer is disposed below the first light-transmissive layer. The first display layer has a second width in the second direction. The first display layer includes a circuit layer. The flexible display module is configured to be bent along an axis, the axis extends along a first direction, the first direction is perpendicular to the second direction, and the first width is greater than the second width. A line width of the circuit layer more close to a periphery of the display surface is less than a line width of the circuit layer more close to an inner area of the display surface.

15 Claims, 12 Drawing Sheets

(56) References Cited

FOREIGN PATENT DOCUMENTS

| CN | 108241241 | A |   | 7/2018  |         |
|----|-----------|---|---|---------|---------|
| CN | 109037281 | A | * | 12/2018 | ............. G09F 9/301 |
| CN | 109037281 | A |   | 12/2018 |         |
| CN | 109166461 | A |   | 1/2019  |         |
| CN | 109616017 | A |   | 4/2019  |         |
| CN | 208938546 | U |   | 6/2019  |         |
| CN | 110504295 | A | * | 11/2019 | ............. H01L 27/32 |
| CN | 110504295 | A |   | 11/2019 |         |
| CN | 110534021 | A |   | 12/2019 |         |
| CN | 112002227 | A |   | 11/2020 |         |

\* cited by examiner

FLEXIBLE DISPLAY MODULE

RELATED APPLICATIONS

This application claims priority to Taiwanese Application Serial Number 109147228, filed Dec. 31, 2020, which is herein incorporated by reference.

BACKGROUND

Field of Invention

The present invention relates to a display module. More particularly, the present invention relates to a flexible display module.

Description of Related Art

With the mobile technology spreading around the world, the display module within the mobile device is one of the objects that people want to improve. Recently, the flexible display module is developed, such that the display area and the shape of the mobile device can be changed, which is friendly to be carried by the user.

However, the bending of the flexible display module causes stress in the stacked layers of the flexible display module. After multiple times of bending, the stress may lead to the peeling of the display module, thereby losing the display function. Therefore, there is a need to provide a flexible display module that satisfies both display and bending functions.

SUMMARY

An aspect of the present invention is to provide a flexible display module, which can be bent and still have display function.

According to some embodiments of the invention, a flexible display module includes a first light-transmissive layer and a first display layer. The first light-transmissive layer includes a display surface. The first light-transmissive layer has a first width in a second direction. The first display layer is disposed below the first light-transmissive layer. The first display layer has a second width in the second direction. The first display layer includes a circuit layer. The flexible display module is configured to be bent along an axis, the axis extends along a first direction, the first direction is perpendicular to the second direction, and the first width is greater than the second width. A line width of the circuit layer more close to a periphery of the display surface is less than a line width of the circuit layer more close to an inner area of the display surface.

According to some embodiments of the invention, the first display layer comprises at least one first groove, the axis passes through the first groove, and the first groove is recessed from an edge of the first display layer.

According to some embodiments of the invention, the first groove has a plurality of chamfers, and the axis is between the chamfers.

According to some embodiments of the invention, the chamfers have concave surfaces.

According to some embodiments of the invention, the flexible display module further includes a first adhesive layer disposed between the first light-transmissive layer and the first display layer.

According to some embodiments of the invention, the first adhesive layer includes a plurality of first adhesive pieces, the first adhesive pieces are spaced apart by a plurality of first trenches and a plurality of second trenches, the first trenches extend along the first direction, and the second trenches extend along the second direction.

According to some embodiments of the invention, each of the first adhesive pieces has a first length in the first direction and a second length in the second direction, the first length ranges from 3 mm to 15 mm, and the second length ranges from 3 mm to 15 mm.

According to some embodiments of the invention, the first adhesive layer comprises a plurality of first adhesive pieces and a plurality of connecting lines, and the first adhesive pieces are partially connected by the connecting lines.

According to some embodiments of the invention, a thickness of the connecting lines is smaller than a thickness of the first adhesive pieces.

According to some embodiments of the invention, the first adhesive pieces and the connecting lines construct a zigzag structure.

According to some embodiments of the invention, the first adhesive layer includes a first adhesive positioned away from the axis, a second adhesive positioned close to the axis, and a third adhesive disposed among the second adhesive. A Young's modulus of the first adhesive is greater than a Young's modulus of the second adhesive, and the Young's modulus of the second adhesive is greater than a Young's modulus of the third adhesive.

According to some embodiments of the invention, the Young's modulus of the first adhesive is about 20 MPa to about 300 MPa, the Young's modulus of the second adhesive is about 1 MPa to about 20 MPa, and the Young's modulus of the third adhesive is about 0.01 MPa to about 1 MPa.

According to some embodiments of the invention, the flexible display module further includes a back board disposed below the first display layer and having a third width in the second direction, wherein the third width is smaller than the second width.

According to some embodiments of the invention, the flexible display module further includes a first adhesive layer disposed between the first light-transmissive layer and the first display layer, a second adhesive layer disposed between the back board and the first display layer.

According to some embodiments of the invention, the first adhesive layer comprises a plurality of first adhesive pieces, the first adhesive pieces are spaced apart by a plurality of first trenches and a plurality of second trenches, the first trenches extend along the first direction, the second trenches extend along the second direction, the second adhesive layer comprises a plurality of second adhesive pieces, the second adhesive pieces are spaced apart by a plurality of third trenches and a plurality of fourth trenches, the third trenches extend along the first direction, and the fourth trenches extend along the second direction.

According to some embodiments of the invention, the flexible display module further includes a back board disposed below the first display layer and having a third width in the second direction, wherein the first width, the second width, and the third width are sequentially decreased.

According to some embodiments of the invention, the flexible display module further includes a second display layer and a second light-transmissive layer. The back board is disposed between the first display layer and the second display layer. The second display layer is disposed between the back board and the second light-transmissive layer. The second display layer has a fourth width in the second direction, the second light-transmissive layer has a fifth width in the second direction, and the fifth width, the fourth width, and the third width are sequentially decreased.

According to some embodiments of the invention, the flexible display module further includes a first adhesive layer disposed between the back board and the first display layer, and a second adhesive layer disposed between the back board and the second display layer.

According to some embodiments of the invention, the first adhesive layer comprises a first gap, the second adhesive layer comprises a second gap, and the first gap and the second gap are arranged adjacent the axis.

According to some embodiments of the invention, the first gap extends along the first direction, and the second gap extends along the second direction.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
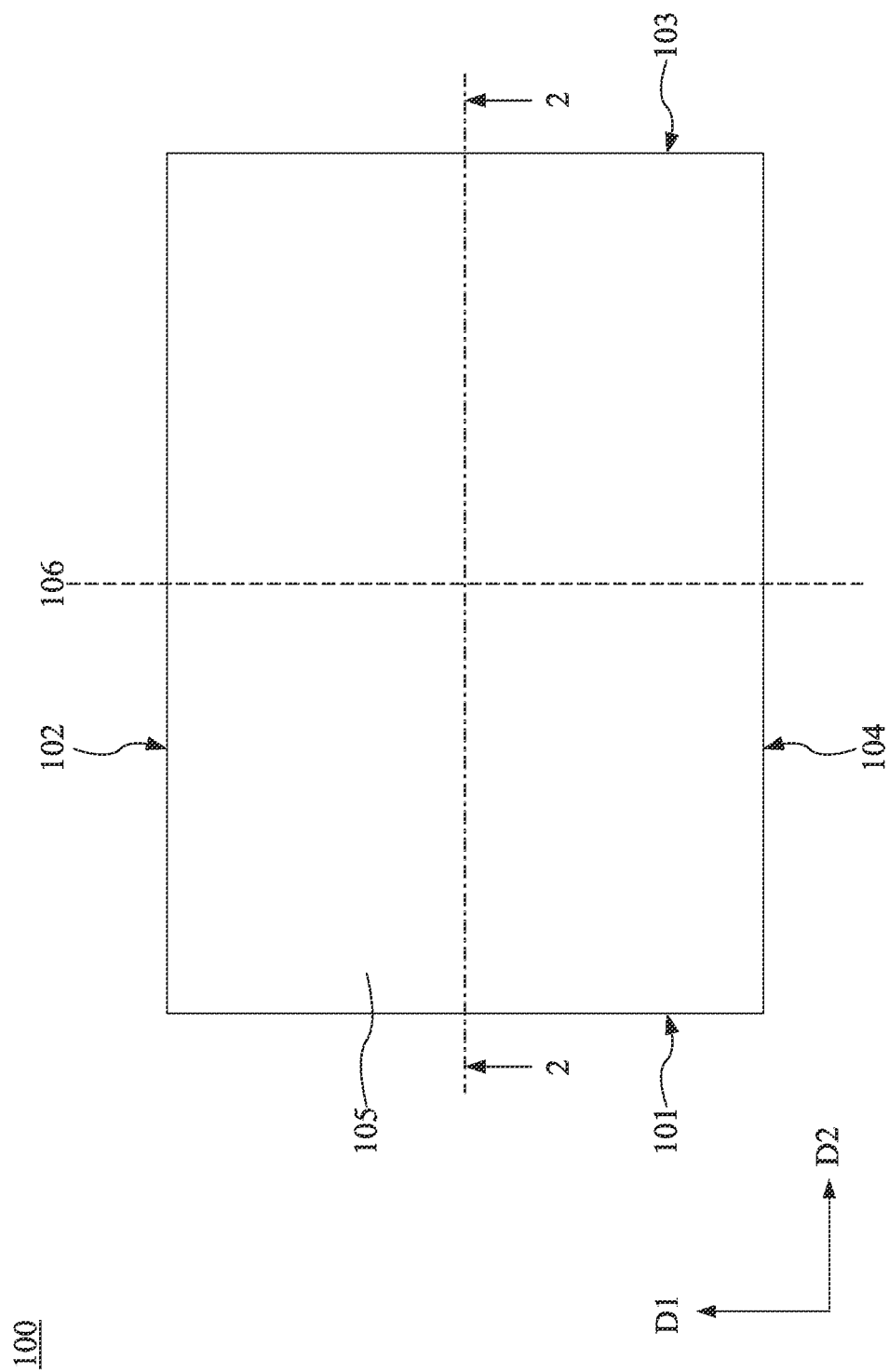
FIG. 1 is a plane view of a flexible display module of some embodiments of the invention.

Reference will now be made in detail to the present embodiments of the invention, examples of which are illustrated in the accompanying drawings. Wherever possible, the same reference numbers are used in the drawings and the description to refer to the same or like parts. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The flexible display module of some embodiments of the invention can be utilized in a mobile phone, but the invention is not limited to. In some other embodiments of the invention, the flexible display module can be utilized in other portable devices such as a pad or a notebook.

Figure 2:
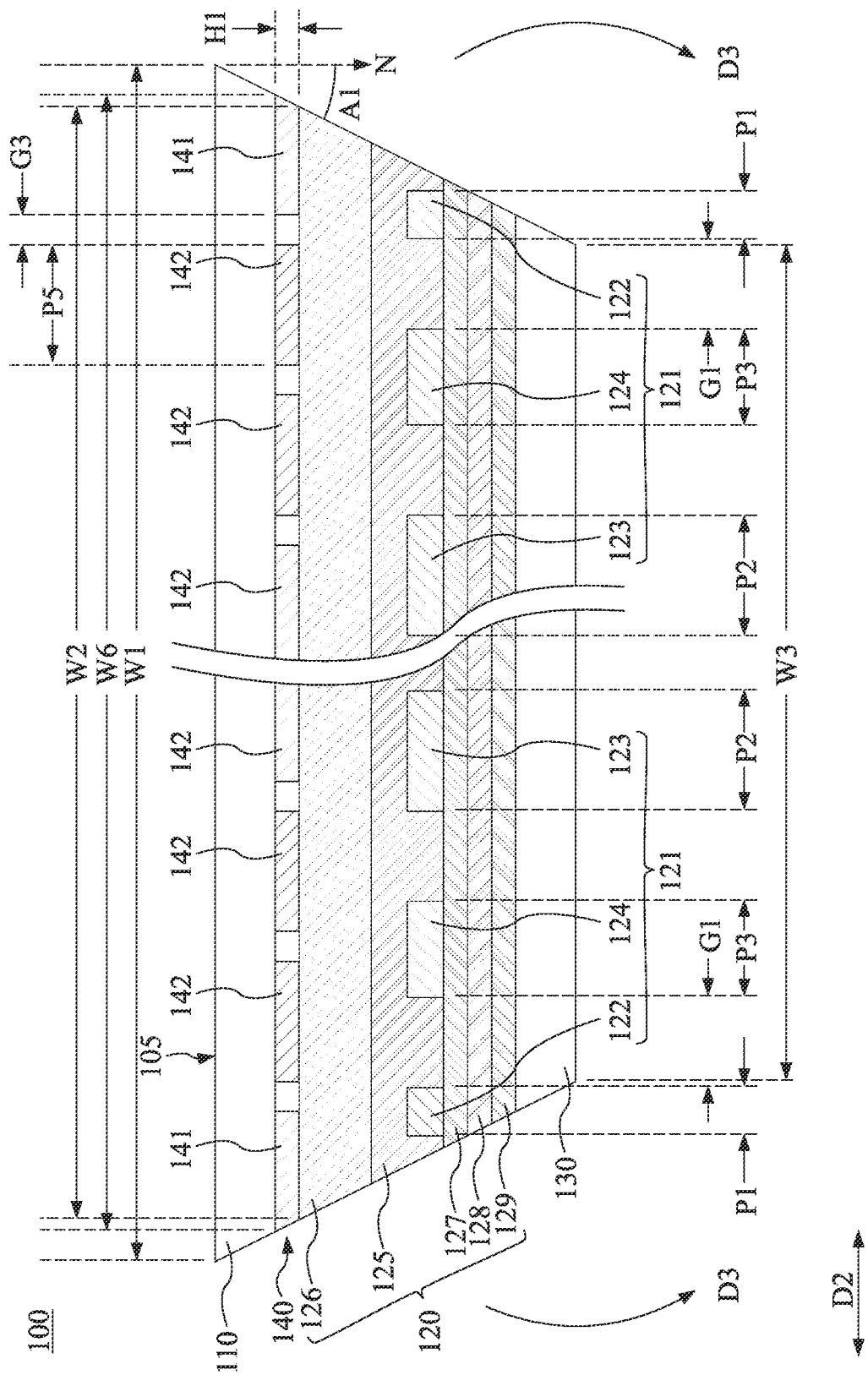
FIG. 2 is a cross-sectional view taken along line 2-2 of FIG. 1.

FIG. 1 is a plane view of a flexible display module of some embodiments of the invention. FIG. 2 is a cross-sectional view taken along line 2-2 of FIG. 1. Please refer to FIG. 1. In some embodiments, the flexible display module 100 can be bent along the axis 106. The axis 106 extends along the first direction D1.

For example, the flexible display module 100 has a display surface 105, and the display surface 105 has a first edge 101, a second edge 102, a third edge 103, and a fourth edge 104. The first edge 101 and third edge 103 extend along the first direction D1, and the second edge 102 and fourth edge 104 extend along the second direction D2. The first direction D1 is substantially perpendicular to the second direction D2. Namely, the first edge 101 and the third edge 103 are parallel to the axis 106, and the second edge 102 and fourth edge 104 are perpendicular to the axis 106. According to some embodiments of the invention, the display surface 105 of the flexible display module 100 has a rectangle shape, but the invention is not limited to. According to some other embodiments of the invention, the display surface of the flexible display module may have other shape.

Please refer to FIG. 2. The flexible display module 100 of some embodiments has a first light-transmissive layer 110 and a first display layer 120. The first display layer 120 is disposed below the first light-transmissive layer 110. The material of the first light-transmissive layer 110 is transparent, and the first light-transmissive layer 110 is disposed above the first display layer 120. The first display layer 120 generates images.

The first light-transmissive layer 110 has the display surface 105, and the first light-transmissive layer 110 has a first width W1 in the second direction D2. The first display layer 120 has a second width W2 in the second direction D2. The first width W1 is greater than the second width W2.

For example, in some embodiments, the first width W1 is the maximum width of the first light-transmissive layer 110 in the second direction D2, and the second width W1 is the maximum width of the first display layer 120 in the second direction D2.

The first display layer 120 has a circuit layer 121. The circuit layer 121 has a trace 122 and a trace 123, in which the trace 122 is closer to the edge of the display surface 105, and the trace 123 is closer to the center of the display surface 105. A line width P1 of the trace 122 is smaller than a line width P2 of the trace 123. The circuit layer 121 in the drawing is located at a non-display area of the first display layer 120. For example, the circuit layer 121 can be a peripheral circuit electrically connected to a pixel electrode of the first display layer 120.

Because the first light-transmissive layer 110 has a first width W1 in the second direction D2, the first display layer 120 has a second width W2 in the second direction D2, the first width W1 is greater than the second width W2, and the second direction D2 is perpendicular to the axis 106, thus the stress between the lamination of the layers of the flexible display module 100 while bending the flexible display module 100 can be reduced, the problem of peeling of the lamination of the layers of the flexible display module 100 can be also prevented.

Additionally, the line width P1 of the circuit layer 121 closer to the edge of the display surface 105 is smaller than the line width P2 of the circuit layer 121 closer to the center of the display surface 105, thus the stress between the lamination of the layers of the flexible display module 100 while bending the flexible display module 100 can be further reduced.

More particularly, a side of the first light-transmissive layer 110 including the display surface 105 has the first width W1 in the second direction D2, and a side of the first light-transmissive layer 110 away from the display surface 105 has a sixth width W6 in the second direction D2. The first width W1 is greater than the sixth width W6. The opposite ends of the first light-transmissive layer 110 have inclined surfaces in the second direction D2.

Relative to the normal direction N of the display surface 105, an angle A1 between the inclined surfaces at opposite ends of the first light-transmissive layer 110 and the normal direction N of the display surface 105 is about 5 degrees to 30 degrees.

In some embodiments, the flexible display module 100 includes a back board 130. The back board 130 is disposed below the first display layer 120. The back board 130 has a third width W3 in the second direction D2. The first width W1, the second width W2, and the third width W3 are sequentially decreased.

More particularly, a side of the back board 130 closer to the display surface 105 has the second width W2 in the second direction D2, and a side of the back board 130 away from the display surface 105 has the third width W3 in the second direction D2. The first width W1 of the first light-transmissive layer 110 is greater than the second width W2, and the second width W2 is greater than the third width W3 of the back board 130. Therefore, the opposite ends of the first display layer 120 have inclined surfaces in the second direction D2, and the opposite ends of the back board 130 have inclined surfaces in the second direction D2. In some embodiments, the inclined surfaces of the first light-transmissive layer 110, the first display layer 120, and the back board 130 are continuous and have the same slope. In some other embodiments, the inclined surfaces of the first light-transmissive layer 110, the first display layer 120, and the back board 130 are continuous and have the different slopes.

The circuit layer 121 further includes a trace 124, and the trace 124 is disposed between the trace 122 and the trace 123. The trace 124 has a line width P3 in the second direction D2. The line width P1 of the trace 122 is smaller than the line width P3 of the trace 124, and the line width P3 of the trace 124 is smaller than the line width P2 of the trace 123. In the second direction D2, there is a gap G1 between the trace 122 and the trace 124.

For example, the line width P1 of the trace 122 is about 3 μm to 5 μm, the line width P3 of the trace 124 is about 15 μm to 50 μm, the line width P2 of the trace 123 is about 100 μm to second adhesive layer 150 μm, and the gap G1 is about 50 μm to 200 μm.

The flexible display module 100 further includes a first adhesive layer 140. The first adhesive layer 140 is disposed between the first light-transmissive layer 110 and the first display layer 120.

Figure 3:
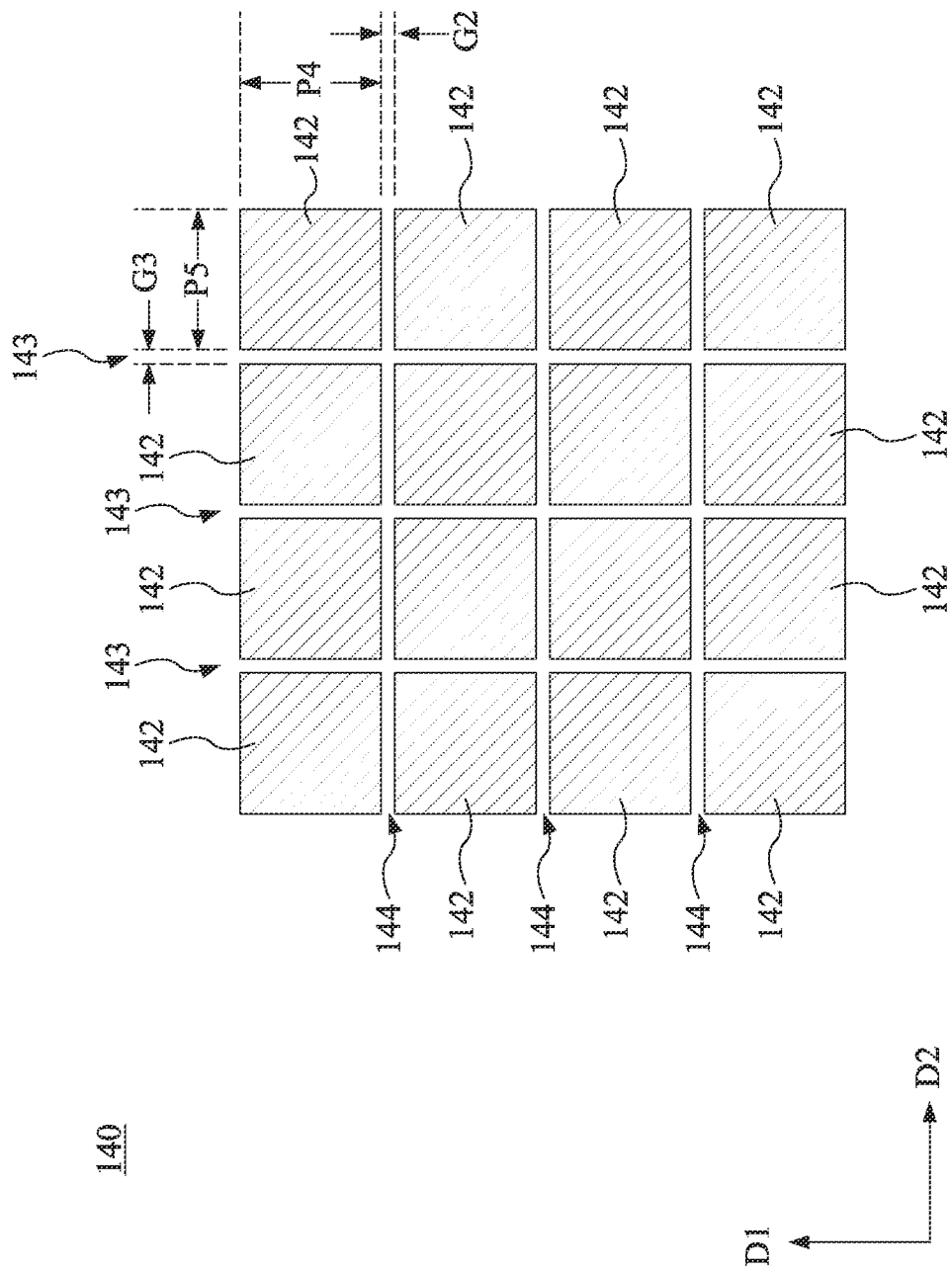
FIG. 3 is a plane view of a center region of the first adhesive layer according to some embodiments of the invention.

Additionally, the first adhesive layer 140 includes a plurality of first adhesive pieces 142. FIG. 3 is a plane view of a center region of the first adhesive layer 140 according to some embodiments of the invention. These first adhesive pieces 142 are spaced apart by a plurality of first trenches 143 and a plurality of second trenches 144. The first trenches 143 extend along the first direction D1, and the second trenches 144 extend along the second direction D2.

Each of the first adhesive pieces 142 has a first length P4 in the first direction D1 and has a second length P5 in the second direction D2. For example, the first length P4 is about 3 mm to 15 mm, and the second length P5 is about 3 mm to 15 mm. Each of the first trenches 143 has a gap G3 in the second direction D2, and each of the second trenches 144 has a gap G2 in the first direction D1. For example, the gap G2 is about 100 μM to 500 μM, and the gap G3 is about 100 μM to 500 μM. In the normal direction N of the display surface 105, the first adhesive layer 140 has a thickness H1, and the thickness H1 is about the gap G2 is about 10 μm to 500 μM.

On the other hand, referring back to FIG. 2, the first adhesive layer 140 has a plurality of adhesive pieces 141 at the peripheral in the second direction D2, and the adhesive pieces 141 have inclined surfaces facing outwards.

In some embodiments, the adhesive pieces 141 and the first adhesive pieces 142 can be optical clear adhesive (OCA), but the invention is not limited to. Furthermore, a Young's modulus of the adhesive pieces 141 and the first adhesive pieces 142 is about 0.001 to 300 MPa, such that the flexible display module 100 can be bent easily.

The first display layer 120 includes an insulating film 129, a first dielectric layer 128, a second dielectric layer 127, a planarization layer 125, and a third dielectric layer 126.

The insulating film 129 is formed on the back board 130, and a length of the insulating film 129 in the second direction D2 is greater than the third width of the back board 130. The side surfaces of the insulating film 129 in the second direction D2 and the back board 130 together form the inclined surfaces. The material of the insulating film 129 for example can be the material having good thermal resistance, flexible, and low dielectric constant, such as polyimide (Ph.

The first dielectric layer 128 is formed on the insulating film 129, and the length of the first dielectric layer 128 in the second direction D2 is greater than the length of the insulating film 129 in the second direction D2. Also, the side surfaces of the first dielectric layer 128 in the second direction D2 and the back board 130 and the insulating film 129 together form the inclined surfaces. The first dielectric layer 128 can be a single layer of dielectric material or multi-layer of dielectric materials. For example, the first dielectric layer 128 can include a buffer layer (BL) and a gate insulator (GI).

The second dielectric layer 127 is formed on the first dielectric layer 128, and the length of the second dielectric layer 127 in the second direction D2 is greater than the length of the first dielectric layer 128 in the second direction D2. Also, the side surfaces of the second dielectric layer 127 in the second direction D2 and the back board 130, the insulating film 129, and the first dielectric layer 128 together form the inclined surfaces. For example, the second dielectric layer 127 can be an insulation dielectric (ILD) layer.

The planarization layer 125 is formed on the second dielectric layer 127 and covers the circuit layer 121. The length of the planarization layer 125 in the second direction D2 is greater than the length of the second dielectric layer 127 in the second direction D2. Also, the side surfaces of the planarization layer 125 in the second direction D2 and the back board 130, the insulating film 129, the first dielectric layer 128, and the second dielectric layer 127 together form the inclined surfaces. For example, the planarization layer 125 can be an insulation layer (IL) having sufficient thickness. In some embodiments, the first display layer 120 is an organic light-emitting diode display layer, and the planarization layer 125 includes light-emitting layers and an organic photoresist layer for defining pixels.

Figure 4:
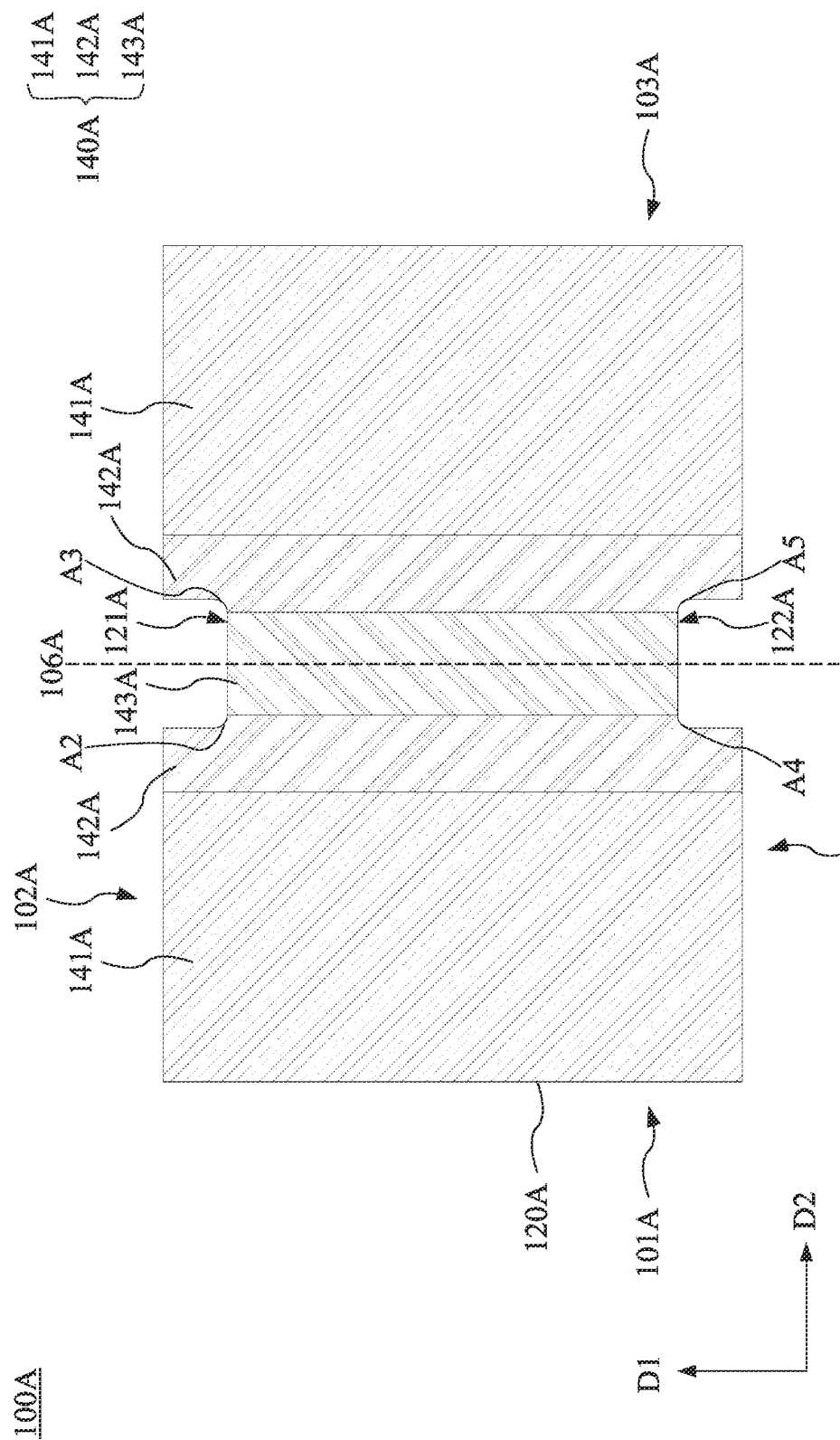
FIG. 4 is a plane view of the flexible display module according to some other embodiments of the invention.

FIG. 4 is a plane view of the flexible display module according to some other embodiments of the invention, in which the first light-transmissive layer is omitted in FIG. 4. The flexible display module 100A is similar to the flexible display module 100 described above, and the similar elements and the description thereof would not be repeated again. The first adhesive layer 140A is disposed on the first display layer 120A in the flexible display module 100A. In some embodiments, the first display layer 120A includes a first groove 121A and a first groove 122A.

The flexible display module 100A is configured to be bent along the axis 106A, in which the axis 106A passes through the first groove 121A and the first groove 122A. The first groove 121A and the first groove 122A are respectively recessed from the edges of the first display layer 120A.

For example, the flexible display module 100A has a first edge 101A, a second edge 102A, a third edge 103A, and a fourth edge 104A. The first edge 101A and the third edge 103A are parallel to the first direction D1, and the second edge 102A and the fourth edge 104A are parallel to the second direction D2. In some embodiments, the first groove 121A is formed at an edge of the first display layer 120A that corresponds to the second edge 102A and is recessed from this edge. The first groove 122A is formed at an edge of the first display layer 120A that corresponds to the fourth edge 104A and is recessed from this edge. Namely, the first groove 121A and the first groove 122A are recessed from the edges of the first display layer 120A along the first direction D1.

More particularly, the first groove 121A has a chamfer A2 and a chamfer A3, and the axis 106A is between the chamfer A2 and the chamfer A3. In some embodiments, the chamfer A2 and the chamfer A3 respectively have a concave surface, and the chamfer A2 and the chamfer A3 are symmetric to the axis 106A.

The first groove 122A has a chamfer A4 and a chamfer A5, and the axis 106A is between the chamfer A4 and the chamfer A5. In some embodiments, the chamfer A4 and the chamfer A4 respectively have a concave surface, and the chamfer A4 and the chamfer A5 are symmetric to the axis 106A.

On the other hand, the first adhesive layer 140A includes a first adhesive 141A, a second adhesive 142A, and a third adhesive 143A. The first adhesive 141A is disposed away from the axis 106A, the third adhesive 143A is disposed close to the axis 106A and among the second adhesive 142A, and the second adhesive 142A is disposed between the first adhesive 141A and the third adhesive 143A.

A Young's modulus of the first adhesive 141A is greater than a Young's modulus of the second adhesive 142A, and the Young's modulus of the second adhesive 142A is greater than a Young's modulus of the third adhesive 143A. For example, in some embodiments, the Young's modulus of the first adhesive 141A is about 20 MPa to about 300 MPa, the Young's modulus of the second adhesive 142A is about 1 MPa to about 20 MPa, and the Young's modulus of the third adhesive 143A is about 0.01 MPa to about 1 MPa. The first adhesive 141A is directly in contact with the second adhesive 142A, and the second adhesive 142A is directly in contact with the third adhesive 143A.

Figure 5:
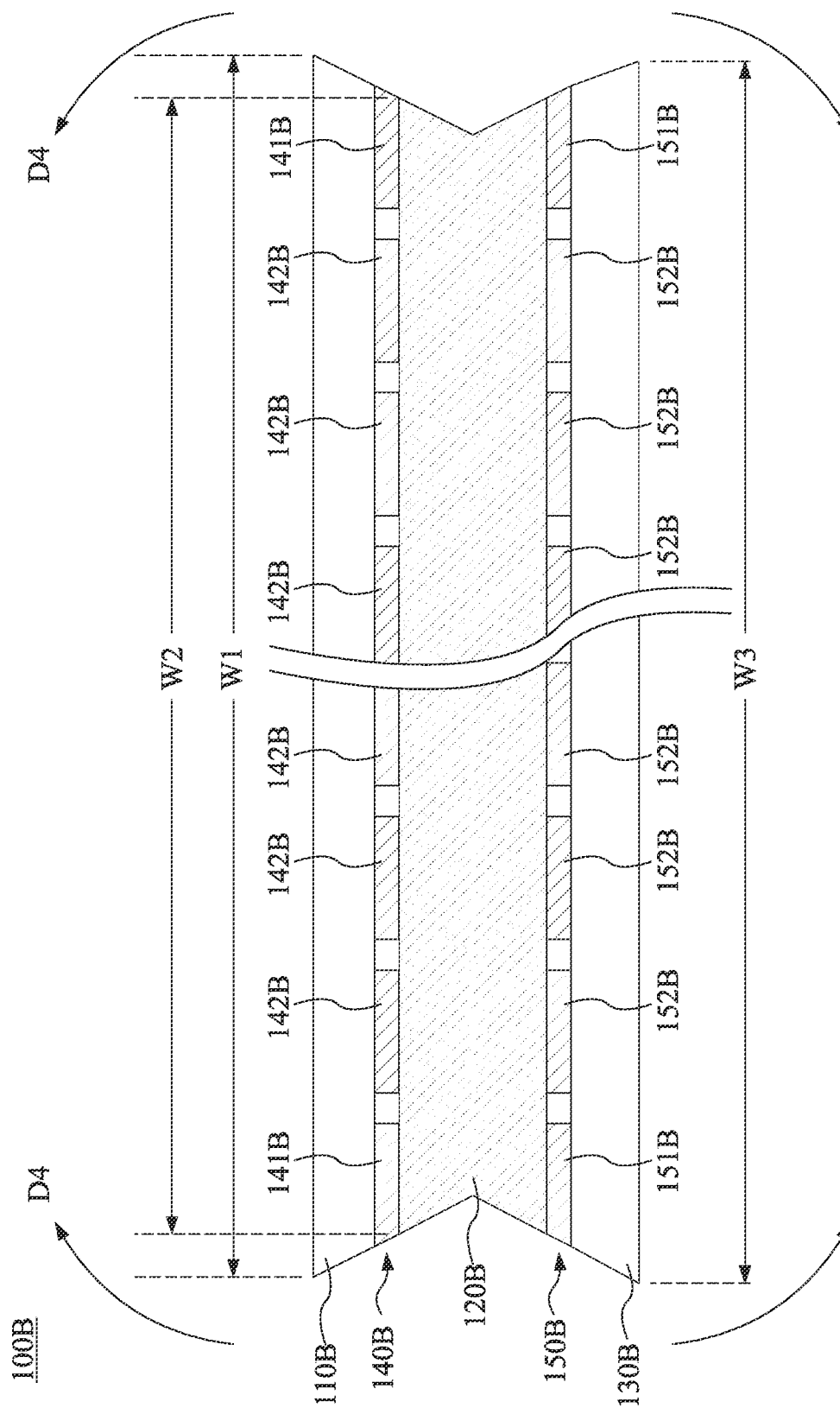
FIG. 5 is a cross-sectional view according to some other embodiments of the flexible display module of the invention.

FIG. 5 is a cross-sectional view according to some other embodiments of the flexible display module of the invention. The flexible display module 100B includes a first light-transmissive layer 110B, a first display layer 120B, and a back board 130B. The first display layer 120B is disposed below the first light-transmissive layer 110B, and the back board 130B is disposed below the first display layer 120B.

The first light-transmissive layer 110B has a first width W1 in the second direction D2. The first display layer 120B has a second width W2 in the second direction D2. The back board 130B has a third width W3 in the second direction D2. The first width W1 is greater than the second width W2, and the second width W2 is greater than the third width W3. Additionally, the first width W1 is similar to the third width W3. In some embodiments, first display layer 120B can be similar to the first display layer 120 including the lamination of the circuit layer, the third dielectric layer, the insulating film, and the dielectric layer described above. The first display layer 120B has a narrowest width in the middle of the lamination.

In some embodiments, the flexible display module 100B further includes the first adhesive layer 140B and the second adhesive layer 150B. The first adhesive layer 140B is disposed between the first light-transmissive layer 110B and the first display layer 120B. The second adhesive layer 150B id disposed between the back board 130B and the first display layer 120B. Namely, the first display layer 120B is disposed between the first adhesive layer 140B and the second adhesive layer 150B.

The flexible display module 100B of the embodiments can be bent along the direction D3 or the direction D4 without generating too much stress between the layers of the lamination.

Figure 6:
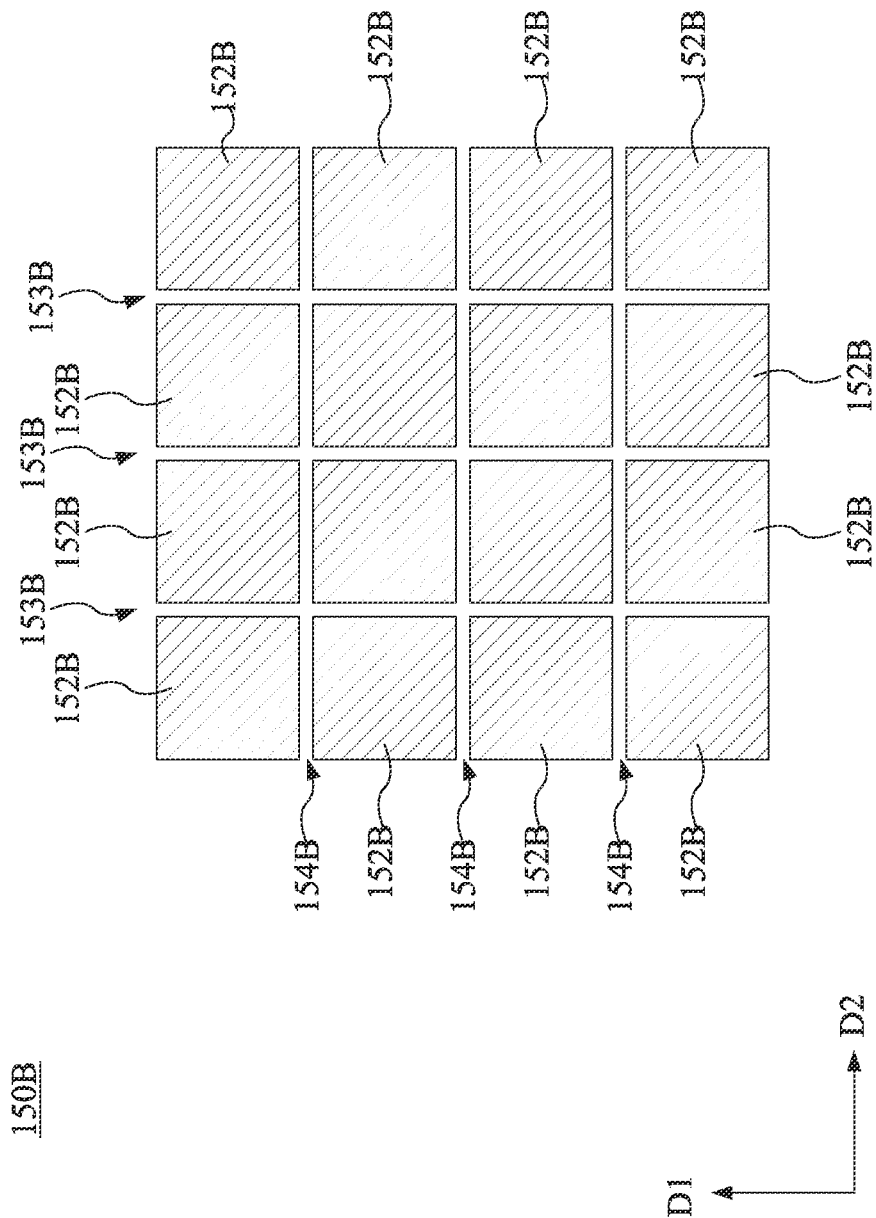
FIG. 6 is a plane view of a center region of the second adhesive layer according to some embodiments of the invention.

The first adhesive layer 140B is similar to the first adhesive layer 140B described above, which includes a plurality of first adhesive pieces 142B, and the detail description thereof is not repeated again. The first adhesive layer 140B includes a plurality of adhesive pieces 141B at the periphery. FIG. 6 is a plane view of a center region of the second adhesive layer 150B according to some embodiments of the invention. The second adhesive layer 150B includes a plurality of second adhesive pieces 152B. These second adhesive pieces 152B are spaced apart by a plurality of third trenches 153B and a plurality of fourth trenches 154B. The third trenches 153B extend along the first direction D1, and the fourth trenches 154B extend along the second direction D2.

In the second direction D2, the second adhesive layer 150B has a plurality of adhesive pieces 151B at the outer edges. The side surfaces of the adhesive pieces 151B facing outwards and the side surfaces of the first display layer 120B and the back board 130B together form inclined surfaces.

Figure 7:
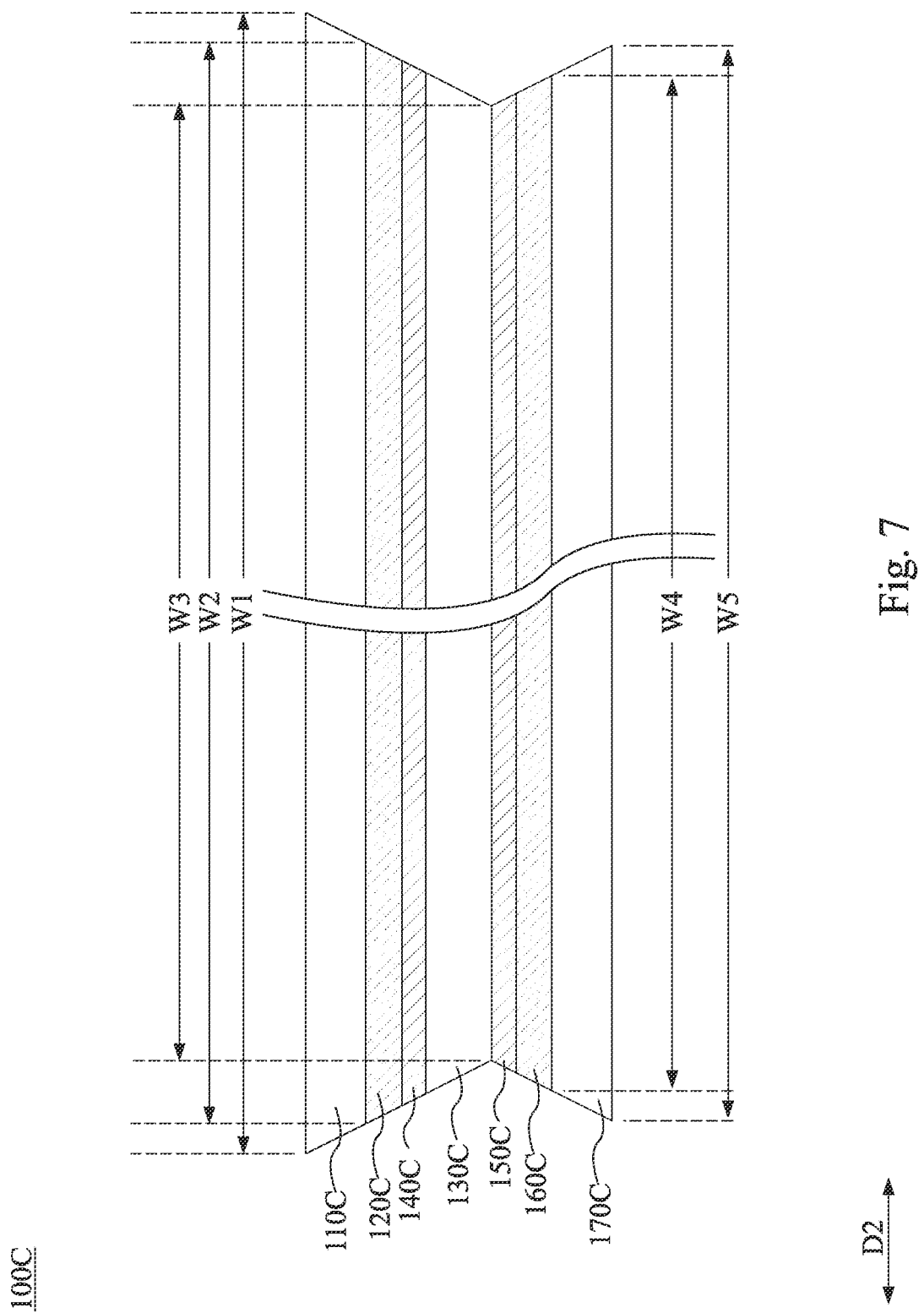
FIG. 7 is a cross-sectional view of the flexible display module according to some other embodiments of the invention.

FIG. 7 is a cross-sectional view of the flexible display module according to some other embodiments of the invention. The flexible display module 100C includes a first light-transmissive layer 110C, a first display layer 120C, a back board 130C, a second display layer 160C and a second light-transmissive layer 170C. The back board 130C is disposed between the first display layer 120C and the second display layer 160C. The second display layer 160C is disposed between the back board 130C and the second light-transmissive layer 170C. The flexible display module 100C is configured to provide two display surfaces in some embodiments.

In the second direction D2, the first light-transmissive layer 110C has a first width W1, the first display layer 120C has a second width W2, the back board 130C has a third width W3, the second display layer 160C has a fourth width W4, and the second light-transmissive layer 170C has a fifth width W5. More particularly, a side of the back board 130C close to the second display layer 160C has the third width W3. The first width W1, the second width W2, and the third width W3 are sequentially decreased, and the fifth width W5, the fourth width W4, and the third width W3 are sequentially decreased.

Additionally, the flexible display module 100C further includes a first adhesive layer 140C and a second adhesive layer 150C. The first adhesive layer 140C is disposed between the back board 130C and the first display layer 120C. The second adhesive layer 150C is disposed between the back board 130C and the second display layer 160C.

Figure 8:
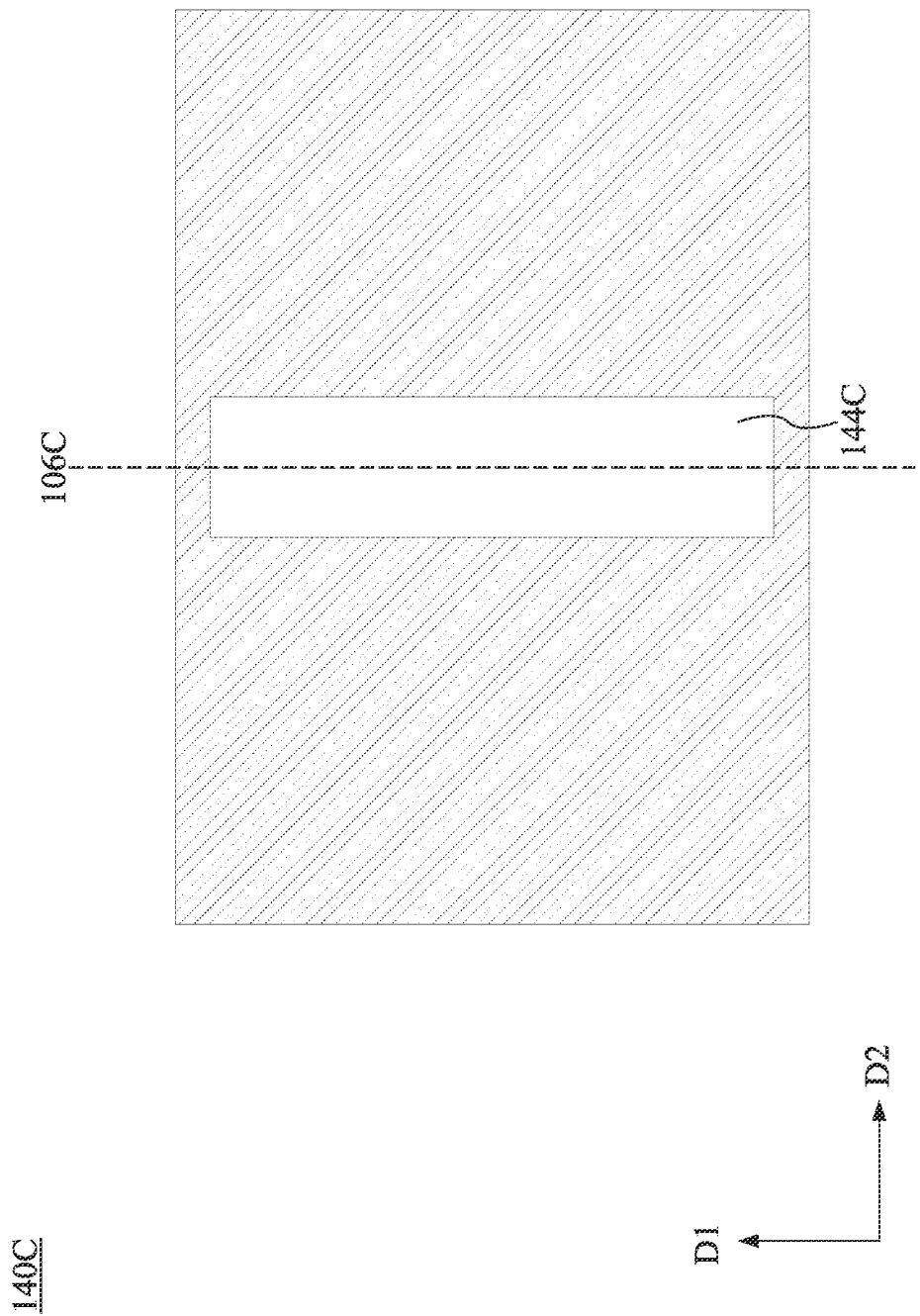
FIG. 8 is a plane view of the first adhesive layer according to some embodiments of the invention.
Figure 9:
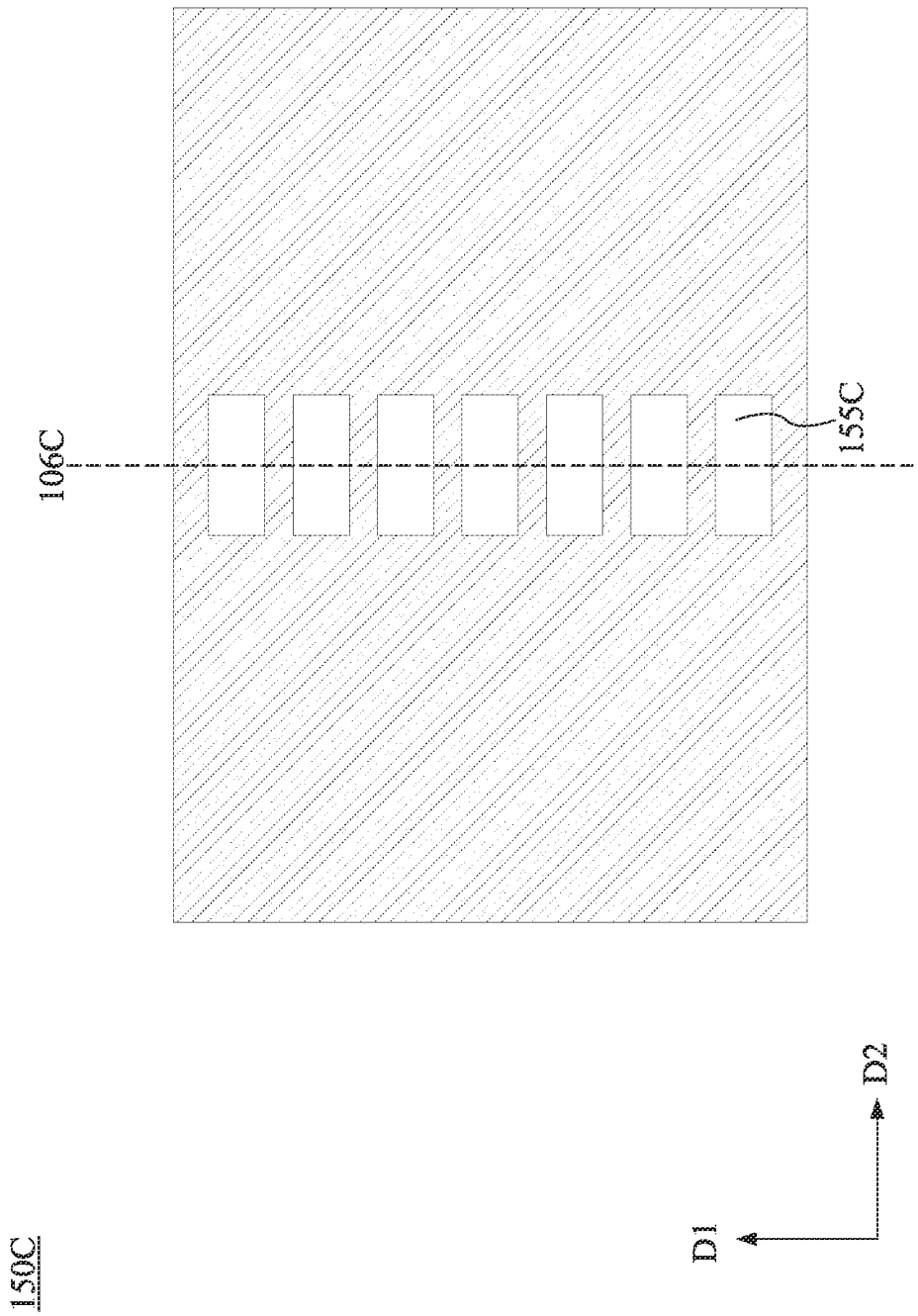
FIG. 9 is a plane view of the second adhesive layer according to some embodiments of the invention.

FIG. 8 is a plane view of the first adhesive layer 140C according to some embodiments of the invention. FIG. 9 is a plane view of the second adhesive layer 150C according to some embodiments of the invention. The flexible display module 100C is configured to be bent along the axis 106C. In some embodiments, the first adhesive layer 140C has a first gap 144C, and the first gap 144C is disposed adjacent the axis 106C.

More particularly, the first gap 144C substantially extends along the first direction D1 which is the direction that axis 106C extends, and the first gap 144C is configured at the region adjacent to the axis 106C in the second direction D2 which is perpendicular to the axis 106C.

The second adhesive layer 150C has a plurality of second gaps 155C. These second gaps 155C are disposed adjacent the axis 106C. More particularly, these second gaps 155C extend along the second direction. These second gaps 155C are arranged along the first direction D1 and configured adjacent to the axis 106C in the second direction D2.

Figure 10:
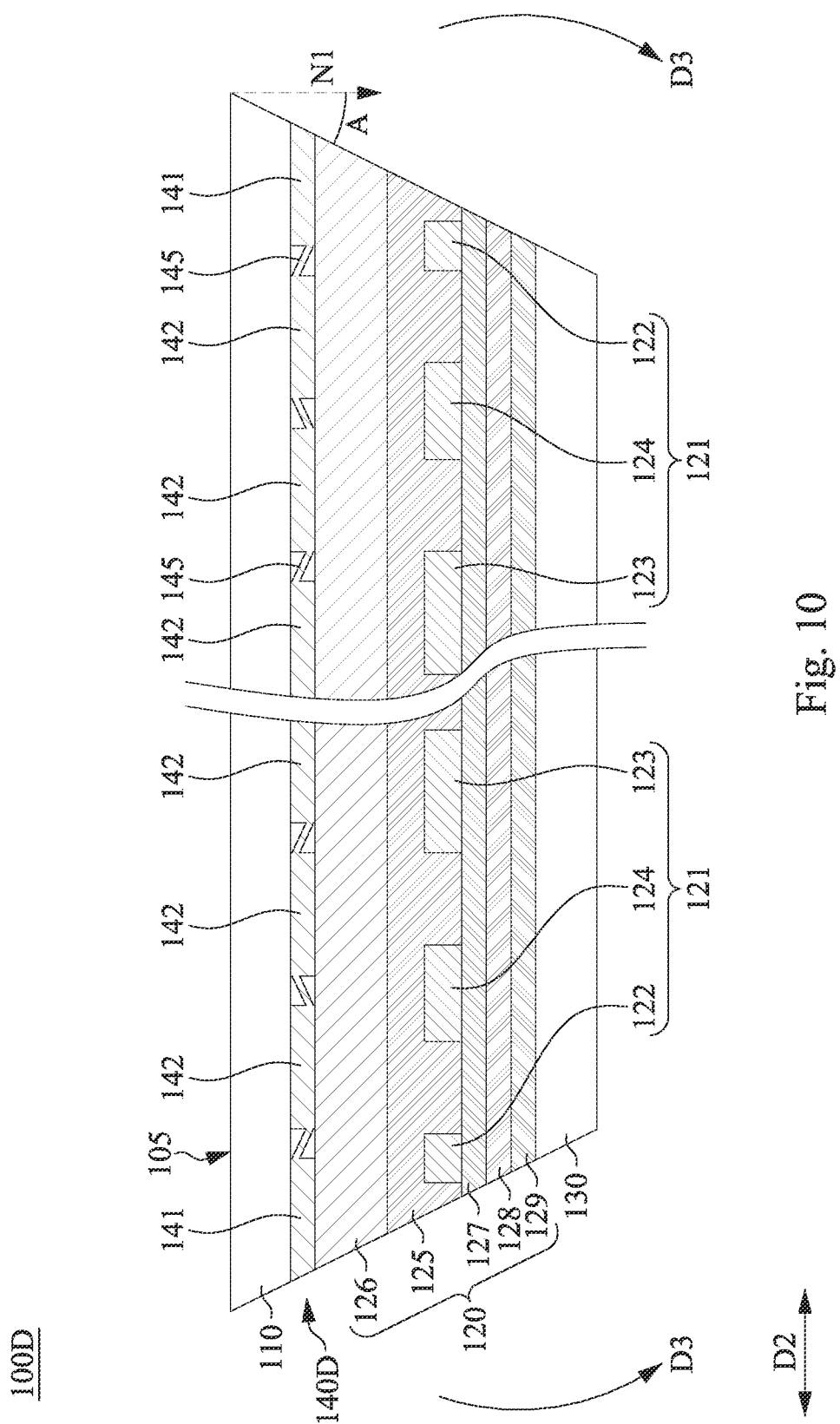
FIG. 10 is a cross-sectional view of the flexible display module according to some embodiments of the invention.
Figure 11:
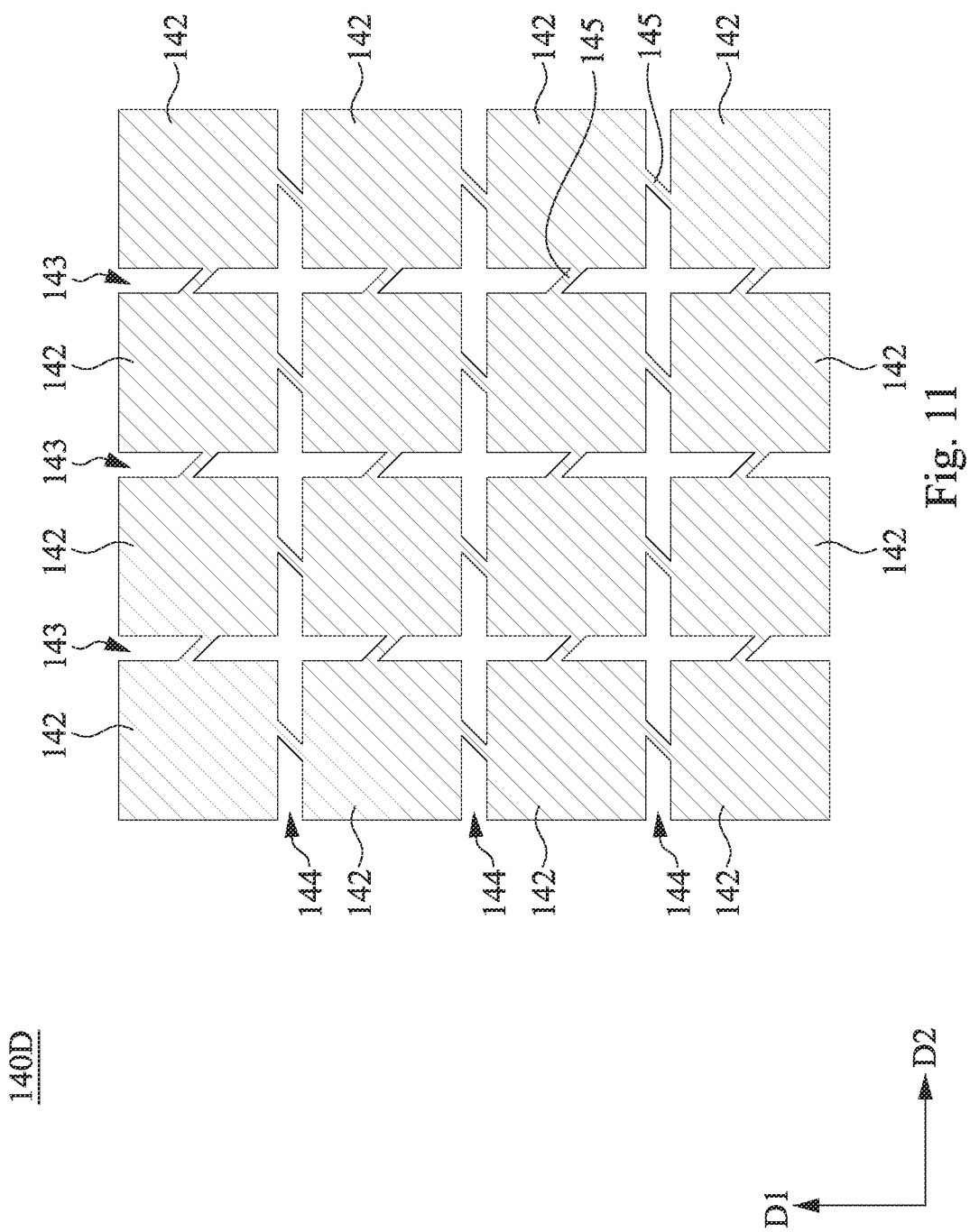
FIG. 11 is a plane view of a center region of the first adhesive layer of FIG. 10.

Reference is made to FIG. 10 and FIG. 11. FIG. 10 is a cross-sectional view of the flexible display module according to some embodiments of the invention. FIG. 11 is a plane view of a center region of the first adhesive layer of FIG. 10. In some embodiments, a first adhesive layer 140D of the flexible display module 100D can be patterned for example by a laser cutting, such that the adhesive pieces 141 at the peripheral of the first adhesive layer 140D are partially connected to the first adhesive pieces 142, and the first adhesive pieces 142 are also partially interconnected. For example, the adhesive pieces 141 and the first adhesive pieces 142 can be partially connected by a plurality of connecting lines 145, and the material of the connecting lines 145 is same as the material of the adhesive pieces 141 and the first adhesive pieces 142, e.g., the OCA. However, a thickness of the connecting lines 145 is smaller than a thickness of the adhesive pieces 141 and the first adhesive pieces 142.

In some embodiments, the connecting lines 145 are inclined connected between the adhesive pieces 141 and first adhesive pieces 142 and between the first adhesive pieces 142. That is, the angle between the connecting lines 145 and the adhesive pieces 141 or the first adhesive pieces 142 is less than 90 degrees. In the top view, the lateral arranged connecting lines 145 are parallel to each other, and the vertical arranged connecting lines 145 are parallel to each other. The orientations of the lateral arranged connecting lines 145 and the vertical arranged connecting lines 145 can be the same or different. By such inclined linkage design, the connecting lines 145 and the adhesive pieces 141 and the first adhesive pieces 142 of the first adhesive layer 140D construct a zigzag structure thereby providing more stretching tolerance.

The design of using the connecting lines 145 to connect the adhesive pieces 141 and the first adhesive pieces 142 can be utilized not only in the first adhesive layer 140D, but can also be utilized in the second adhesive layer 150B of FIG. 5. Details thereof are not described again.

Figure 12:
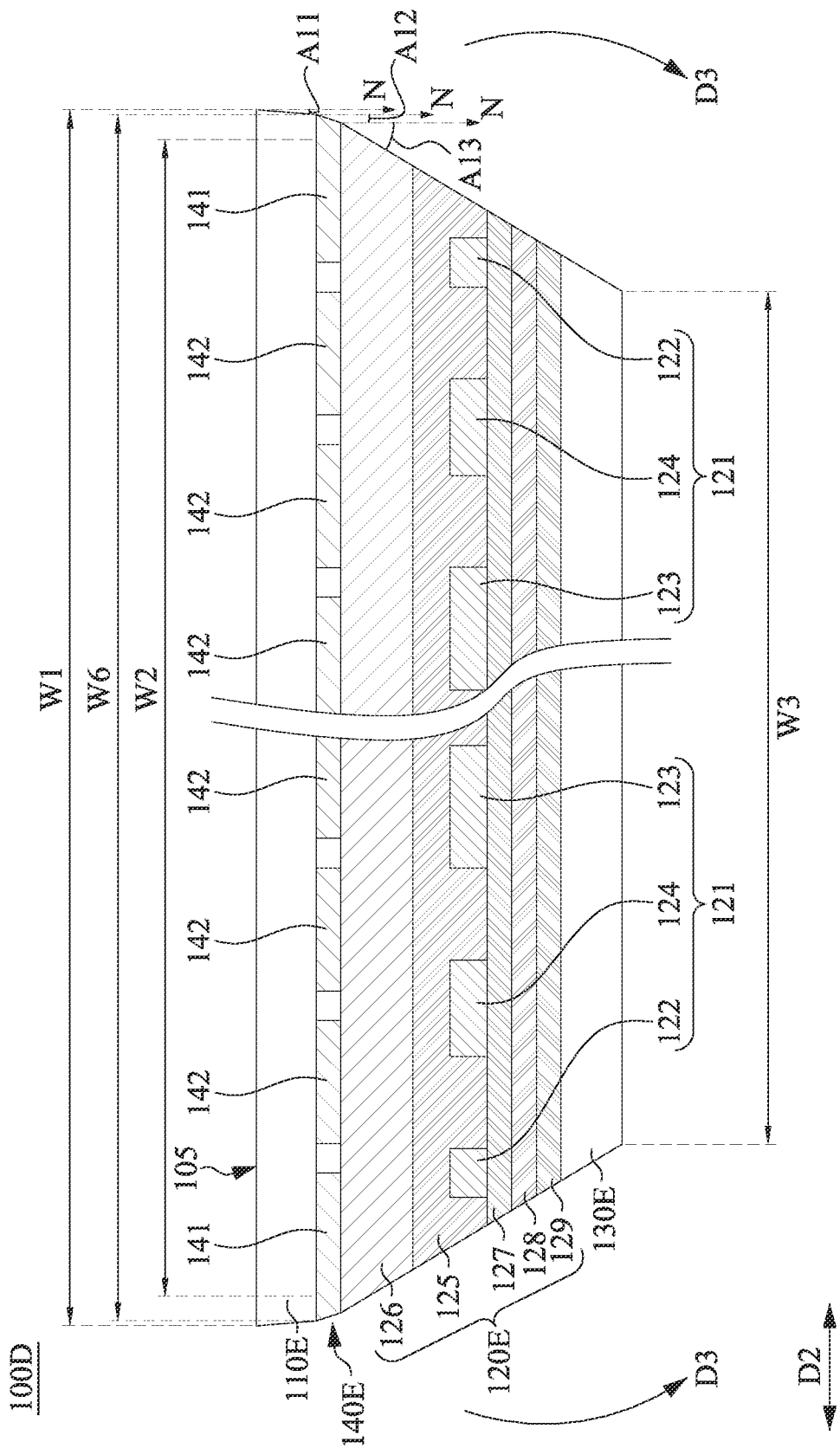
FIG. 12 is a cross-sectional view of the flexible display module of yet other embodiments of the invention.

Reference is made to FIG. 12, which is a cross-sectional view of the flexible display module of yet other embodiments of the invention. In the previous embodiments such as the flexible display module 100 to the flexible display module 100D, the angles A1 between the end surface of the flexible display module 100 to flexible display module 100D and the normal direction N of the display surface 105 are the same. The flexible display module 100E of the embodiments varies the angles at the side surface of the first light-transmissive layer 110E, the side surface of the first adhesive layer 140E, and the side surfaces of the first display layer 120E and the back board 130E.

For example, an angle A11 is defined between the side surface of the first light-transmissive layer 110E and the normal direction N of the display surface 105. An angle A12 is defined between the side surface of the first adhesive layer 140E and the normal direction N of the display surface 105. An angle A13 is defined between the side surfaces of the first display layer 120E and the back board 130E and the normal direction N of the display surface 105. The angle A13 is slightly greater than the angle A12, and the angle A12 is slightly greater than the angle A11. The range of the angle A11, the angle A12, and the angle A13 is about 5 degrees to about 30 degrees.

As a result, a first width W1 of the first light-transmissive layer 110E in the second direction D2 is still greater than a second width W2 of the first display layer 120E in the second direction D2. A side of the first light-transmissive layer 110E away from the display surface 105 has a sixth width W6 in the second direction D2. The first width W1 is greater than the sixth width W6, and the sixth width W6 is greater than the second width W2. A side of the back board 130E away from the display surface 105 has a third width W3 in the second direction D2. The second width W2 is greater than the third width W3 of the back board 130E. The side surfaces of the first light-transmissive layer 110E, the first adhesive layer 140E, the first display layer 120, and the back board 130 can be inclined surfaces in the second direction D2.

The design of varying the angles at opposite ends of the flexible display module 100E can be utilized in the flexible display module 100B of FIG. 5. Details thereof are not described again.

According to some embodiments, the first display layer of the flexible display module has the second width, and the first width of the first light-transmissive layer is greater than the second width. The stress generated while bending the flexible display module can be reduced by the width difference between the first display layer and the first light-transmissive layer in the second direction D2. Additionally, the circuit layer of the first display layer has a narrower line width at the peripheral, such that the stress generated while bending the flexible display module can be further reduced, thereby preventing the problem of peeling.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flexible display module, comprising:
   a first light-transmissive layer comprising a display surface, the first light-transmissive layer having a first width in a second direction;
   a first display layer disposed below the first light-transmissive layer, the first display layer having a second width in the second direction, wherein the first display layer comprises a circuit layer;
   a back board disposed below the first display layer and having a third width in the second direction, wherein the third width is smaller than the second width;
   a first adhesive layer disposed between the first light-transmissive layer and the first display layer; and
   a second adhesive layer disposed between the back board and the first display layer,
   wherein the flexible display module is configured to be bent along an axis, the axis extends along a first direction, the first direction is perpendicular to the second direction, and the first width is greater than the second width,
   wherein a line width of the circuit layer more close to a periphery of the display surface is less than a line width of the circuit layer more close to an inner area of the display surface,
   wherein the first adhesive layer comprises a plurality of first adhesive pieces, the first adhesive pieces are spaced apart by a plurality of first trenches and a plurality of second trenches, the first trenches extend along the first direction, the second trenches extend along the second direction, the second adhesive layer comprises a plurality of second adhesive pieces, the second adhesive pieces are spaced apart by a plurality of third trenches and a plurality of fourth trenches the third trenches extend along the first direction, and the fourth trenches extend along the second direction.

2. The flexible display module of claim 1, wherein the first display layer comprises at least one first groove, the axis passes through the first groove, and the first groove is recessed from an edge of the first display layer.

3. The flexible display module of claim 2, wherein the first groove comprises a plurality of chamfers, and the axis is between the chamfers.

4. The flexible display module of claim 3, wherein the chamfers have concave surfaces.

5. The flexible display module of claim 1, wherein each of the first adhesive pieces has a first length in the first direction and a second length in the second direction, the first length ranges from 3 mm to 15 mm, and the second length ranges from 3 mm to 15 mm.

6. The flexible display module of claim 1, wherein the first adhesive layer comprises:
   a first adhesive positioned away from the axis;
   a second adhesive positioned close to the axis; and
   a third adhesive disposed among the second adhesive,
   wherein a Young's modulus of the first adhesive is greater than a Young's modulus of the second adhesive, and the Young's modulus of the second adhesive is greater than a Young's modulus of the third adhesive.

7. The flexible display module of claim 6, wherein the Young's modulus of the first adhesive is about 20 MPa to about 300 MPa, the Young's modulus of the second adhesive is about 1 MPa to about 20 MPa, and the Young's modulus of the third adhesive is about 0.01 MPa to about 1 MPa.

8. A flexible display module, comprising:
   a first light-transmissive layer comprising a display surface, the first light-transmissive layer having a first width in a second direction;
   a first display layer disposed below the first light-transmissive layer, the first display layer having a second width in the second direction, wherein the first display layer comprises a circuit layer;
   a back board disposed below the first display layer and having a third width in the second direction, wherein the first width, the second width, and the third width are sequentially decreased;
   a second display layer, wherein the back board is disposed between the first display layer and the second display layer; and
   a second light-transmissive layer, wherein the second display layer disposed between the back board and the second light-transmissive layer,
   wherein the second display layer has a fourth width in the second direction, the second light-transmissive layer has a fifth width in the second direction, and the fifth width, the fourth width, and the third width are sequentially decreased,
   wherein the flexible display module is configured to be bent along an axis, the axis extends along a first direction, the first direction is perpendicular to the second direction, and the first width is greater than the second width, wherein a line width of the circuit layer more close to a periphery of the display surface is less than a line width of the circuit layer more close to an inner area of the display surface.

9. The flexible display module of claim 8, further comprising:
   a first adhesive layer disposed between the back board and the first display layer; and
   a second adhesive layer disposed between the back board and the second display layer.

10. The flexible display module of claim 9, wherein the first adhesive layer comprises a first gap, the second adhesive layer comprises a second gap, and the first gap and the second gap are arranged adjacent the axis.

11. The flexible display module of claim 10, wherein the first gap extends along the first direction, and the second gap extends along the second direction.

12. The flexible display module of claim 8, further comprising a first adhesive layer disposed between the first light-transmissive layer and the first display layer.

13. The flexible display module of claim 12, wherein the first adhesive layer comprises a plurality of first adhesive pieces and a plurality of connecting lines, and the first adhesive pieces are partially connected by the connecting lines.

14. The flexible display module of claim 13, wherein a thickness of the connecting lines is smaller than a thickness of the first adhesive pieces.

15. The flexible display module of claim 13, wherein the first adhesive pieces and the connecting lines construct a zigzag structure.

* * * * *